United States Patent
Sienkiewicz et al.

(10) Patent No.: US 10,910,729 B2
(45) Date of Patent: Feb. 2, 2021

(54) CONDUCTED OTA TEST FIXTURE

(71) Applicant: Telefonaktiebolaget LM Ericsson (publ), Stockholm (SE)

(72) Inventors: Esther Sienkiewicz, Ottawa (CA); Adrien Comeau, Ottawa (CA); Henrik Hallenberg, Lindome (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/774,601

(22) Filed: Jan. 28, 2020

(65) Prior Publication Data
US 2020/0168999 A1    May 28, 2020

Related U.S. Application Data

(62) Division of application No. 15/325,156, filed as application No. PCT/IB2016/056260 on Oct. 18, 2016, now Pat. No. 10,622,724.

(51) Int. Cl.
*H01Q 13/18* (2006.01)
*H01Q 21/06* (2006.01)
(Continued)

(52) U.S. Cl.
CPC ............. *H01Q 13/18* (2013.01); *G01R 29/10* (2013.01); *H01Q 1/38* (2013.01); *H01Q 1/523* (2013.01);
(Continued)

(58) Field of Classification Search
CPC .......... H01Q 13/18; H01Q 1/38; H01Q 21/00; H01Q 1/241
See application file for complete search history.

(56) References Cited

U.S. PATENT DOCUMENTS

| | | |
|---|---|---|
| 7,915,909 B2 | 3/2011 | Dunn et al. |
| 8,519,892 B2 | 8/2013 | Ding et al. |
| (Continued) | | |

FOREIGN PATENT DOCUMENTS

| | | |
|---|---|---|
| CN | 201897616 U | 7/2011 |
| CN | 205211912 | 5/2016 |
| (Continued) | | |

OTHER PUBLICATIONS

Cheng, Yu et al., "Millimeter-Wave Shaped-Beam Substrate Integrated Conformal Array Antenna," IEEE Transactions on Antennas and Propagation, vol. 61, Issue 9, Sep. 2013, IEEE, pp. 4558-4566.
(Continued)

*Primary Examiner* — Graham P Smith
(74) *Attorney, Agent, or Firm* — Withrow & Terranova, PLLC

(57) ABSTRACT

Systems and methods relating to performing individual transmit and/or receive measurements for each antenna element in an antenna array implemented on an Substrate Integrated Antenna Array (SIAA) are disclosed. In some embodiments, an SIAA comprises a substrate, one or more antenna elements at a surface of the substrate, and an electrically conductive via fence having a first side electrically coupled to ground within the substrate and a second side at the surface of the substrate, the electrically conductive via fence separately circumscribing each antenna element of the one or more antenna elements within the substrate. The SIAA enables the use of a respective test structure to perform per-antenna element measurements.

17 Claims, 8 Drawing Sheets

(51) Int. Cl.
*G01R 29/10* (2006.01)
*H04B 17/12* (2015.01)
*H01Q 3/26* (2006.01)
*H01Q 1/52* (2006.01)
*H01Q 1/38* (2006.01)
*H01Q 21/00* (2006.01)
*H01Q 1/42* (2006.01)
*H01Q 1/40* (2006.01)
*H01Q 1/24* (2006.01)

(52) U.S. Cl.
CPC .............. *H01Q 3/267* (2013.01); *H01Q 21/00* (2013.01); *H01Q 21/064* (2013.01); *H04B 17/12* (2015.01); *H01Q 1/241* (2013.01); *H01Q 1/40* (2013.01); *H01Q 1/42* (2013.01)

(56) References Cited

U.S. PATENT DOCUMENTS

| | | | |
|---|---|---|---|
| 9,103,855 | B2 | 8/2015 | Burnett, II et al. |
| 10,622,724 | B2 | 4/2020 | Sienkiewicz et al. |
| 2011/0068990 | A1 | 3/2011 | Grzyb et al. |
| 2014/0259638 | A1 | 9/2014 | Kurz et al. |
| 2014/0300519 | A1 | 10/2014 | Estebe et al. |
| 2015/0048980 | A1 | 2/2015 | Chin |
| 2015/0102225 | A1 | 4/2015 | Sertel et al. |
| 2018/0183150 | A1 | 6/2018 | Sienkiewicz et al. |

FOREIGN PATENT DOCUMENTS

| | | |
|---|---|---|
| CN | 105938382 A | 9/2016 |
| FR | 2978249 A1 | 1/2013 |
| WO | 2014040250 A1 | 3/2014 |

OTHER PUBLICATIONS

Xu, Junfeng et al., "140-GHz SIW LTCC Antenna Array Using a Large Via-Fenced and Slotted Dielectric Loading," 7th European Conference on Antennas and Propagation (EUCAP), Apr. 8-12, 2013, Gothenburg, Sweden, IEEE, pp. 2861-2864.

Notice of Reasons for Rejection for Japanese Patent Application No. 2018-521210, dated Jul. 16, 2019, 6 pages.

International Search Report and Written Opinion for International Patent Application No. PCT/IB2016/056260, dated Jul. 18, 2017, 16 pages.

Written Opinion for International Patent Application No. PCT/IB2016/056260, dated Sep. 26, 2018, 8 pages.

Non-Final Office Action for U.S. Appl. No. 15/325,156, dated Sep. 9, 2019, 8 pages.

Notice of Allowance for U.S. Appl. No. 15/325,156, dated Dec. 26, 2019, 7 pages.

International Preliminary Report on Patentability for International Patent Application No. PCT/IB2016/056260, dated Jan. 9, 2019, 24 pages.

Decision to Grant for Japanese Patent Application No. 2018-521210, dated Oct. 29, 2019, 5 pages.

The First Office Action for Chinese Patent Application No. 201680082993.9, dated Sep. 11, 2020, 17 pages.

CONDUCTED OTA TEST FIXTURE

This application is a divisional of U.S. application Ser. No. 15/325,156, filed Jan. 10, 2017, which is a 35 U.S.C. § 371 national phase filing of International Application No. PCT/IB2016/056260, filed Oct. 18, 2016, the disclosures of which are incorporated herein by reference in their entireties.

TECHNICAL FIELD

The present disclosure relates to a substrate integrated antenna array and, more specifically, to obtaining measurements for individual antenna elements in such an array.

BACKGROUND

Future generation (e.g., Fifth Generation (5G)) cellular communications networks that operate on millimeter frequencies will use a large number of antennas, particularly at the base stations but potentially also at the wireless devices. The antennas utilized by a particular radio node (e.g., a base station or a wireless device) are implemented as an antenna array. The number of antenna elements in such an antenna array is expected to be 128 or even higher. Further, at millimeter frequencies, the antenna array is likely to be integrated with the Radio Frequency (RF) components on a single substrate (e.g., a single Printed Circuit Board (PCB)). A substrate on which the antenna array and, in some implementations, the RF components are integrated is referred to herein as a Substrate Integrated Antenna Array (SIAA).

One issue that will arise for an integrated antenna system with no access to connectors to perform legacy testing is that testing requirements such as, for example, output power, Error Vector Magnitude (EVM), and Adjacent Channel Leakage Ratio (ACLR) will not always be feasible using traditional testing schemes, i.e., conducted testing that utilizes connectors or cables to each transceiver chain. Conducted testing schemes are also referred to herein as connector-based testing schemes. One alternative testing scheme is a radiated testing scheme such as a testing scheme that utilizes an anechoic test chamber. However, radiated testing such that those using an anechoic test chamber require long test times since each antenna element must be tested separately. In addition, radiated testing schemes do not isolate specific antenna elements or transceiver chains in order to investigate broken or degraded antenna elements or transceiver chains.

While conducted testing schemes may be used to separately test transceiver chains, these testing schemes require separate physical connectors to each transceiver chain. However, a conducted testing scheme would be more challenging for SIAAs having a large number of transceiver chain and associated physically small antenna elements since physical connectors to each individual transceiver chain would be challenging. Further, a conducted testing scheme usually requires disconnecting the antenna element from the radio analog parts. Although this test enables observations of the individual radio parts, it introduces undesirable, lossy, and complex circuits. Also, since the antenna elements are disconnected, the conducted testing scheme does not include the antenna elements as part of the test and, therefore, does not provide test coverage of the antenna element.

Even if connector-based test mechanisms are possible, they may not be the best solution for an SIAA or other antenna integrated radio. At higher frequencies (millimeter wave), connector-based test mechanisms are difficult to implement. Further, the connectors provide unnecessary loss, and this loss has a larger impact at high frequencies. Still further, at times, the connectors utilized for the connector-based testing mechanism can be larger in size than the antenna element itself; therefore, the connector-based testing mechanism can be a bulky solution. In some implementations (e.g., mmWave), the needed connector type or size may not exist or may be challenging to manufacture.

Thus, connector-less testing mechanisms for testing an SIAA, e.g., during design and manufacturing, are desired. However, as noted above, conventional over-the-air testing mechanisms are less than ideal because, e.g., they require longer test times, which is particularly problematic as the number of antenna elements increases as the system would have to cycle through testing each antenna element on its own. Therefore, there is a need for a connector-less testing mechanism that enables testing of individual antenna elements and/or radio signal paths for an SIAA and, in particular, an SIAA that includes an antenna array including a large number of antenna elements such as those used for millimeter wave frequencies.

SUMMARY

Systems and methods relating to performing individual transmit and/or receive measurements for each antenna element in an antenna array implemented on a Substrate Integrated Antenna Array (SIAA) are disclosed. In some embodiments, an SIAA comprises a substrate, one or more antenna elements at a surface of the substrate, and an electrically conductive via fence having a first side electrically coupled to ground within the substrate and a second side at the surface of the substrate, the electrically conductive via fence separately circumscribing each antenna element of the one or more antenna elements within the substrate. The SIAA enables the use of a respective test structure to perform per-antenna element measurements.

In some embodiments, the one or more antenna elements comprise a plurality of antenna elements. In some embodiments, the antenna elements are structures on the surface of the substrate. In other embodiments, the antenna elements are slot antenna elements formed in a metal ground plane on the surface of the substrate.

In some embodiments, the electrically conductive via fence comprises a plurality of electrically conductive vias each having a first end coupled to ground within the substrate and a second end at the surface of the substrate. The plurality of electrically conductive vias are positioned in the substrate such that each antenna element of the one or more antenna elements is separately circumscribed by a respective subset of the plurality of electrically conductive vias.

In some embodiments, the electrically conductive via fence is a continuous structure.

In some embodiments, the substrate comprises a mechanical alignment feature. Further, in some embodiments, the mechanical alignment feature comprises at least one of a group consisting of: a groove in the surface of the substrate around a periphery of the substrate, a ridge on the surface of the substrate around a periphery of the substrate, a plurality of pins on the surface of the substrate, and a plurality of holes into the surface of the substrate.

In some embodiments, the substrate is a Printed Circuit Board (PCB).

In some embodiments, the SIAA further comprises a dielectric on a surface of the one or more antenna elements opposite the substrate. In some embodiments, a thickness of the dielectric is less than $\lambda/4$, where $\lambda$ is a wavelength of a carrier frequency to be transmitted or received by the SIAA.

Embodiments of a system comprising an SIAA and a test fixture assembly are also disclosed. In some embodiments, the SIAA comprises a substrate and one or more antenna elements at a surface of the substrate The test fixture assembly comprises one or more cavities formed by one or more materials providing isolation between the plurality of antenna elements. The one or more materials may include an electrically conductive material, a convective coated non-conductive material with a skin depth (i.e., thickness of the convective coating) that is sufficient to provide isolation between the plurality of antenna elements, one or more non-conductive materials that are doped to provide electrical conductivity, or the like. The test fixture assembly is positioned on the surface of the substrate of the SIAA such that, for each cavity of the one or more cavities, sidewalls of the cavity circumscribe a respective one of the plurality of antenna elements such that the one or more cavities electrically isolate the one or more antenna elements.

In some embodiments, the one or more antenna elements comprise a plurality of antenna elements, and the one or more cavities comprise a plurality of cavities. In some embodiments, the antenna elements are structures on the surface of the substrate. In other embodiments, the antenna elements are slot antenna elements formed in a metal ground plane on the surface of the substrate.

In some embodiments, the SIAA further comprises an electrically conductive via fence having a first side electrically coupled to ground within the substrate and a second side at the surface of the substrate. The electrically conductive via fence separately circumscribes each antenna element of the one or more antenna elements within the substrate. The test fixture assembly is positioned on the surface of the substrate of the SIAA such that, for each cavity of the one or more cavities, the sidewalls of the cavity are aligned with and electrically coupled to sections of the electrically conductive via fence that circumscribe a respective one of the plurality of antenna elements such that the via fence and the one or more cavities electrically isolate the one or more antenna elements.

In some embodiments, the sidewalls of the cavity are in physical contact with the sections of the electrically conductive via fence that circumscribe the respective one of the one or more antenna elements.

In some embodiments, the electrically conductive via fence comprises a plurality of electrically conductive vias each having a first end coupled to ground within the substrate and a second end at the surface of the substrate. The plurality of electrically conductive vias are positioned in the substrate such that each antenna element of the one or more antenna elements is separately circumscribed by a respective subset of the plurality of electrically conductive vias. The test fixture assembly is positioned on the surface of the substrate of the SIAA such that, for each cavity of the one or more cavities, sidewalls of the cavity are aligned with and electrically coupled to the subset of the plurality of electrically conductive vias that circumscribe a respective one of the one or more antenna elements such that the via fence and the one or more cavities electrically isolate the one or more antenna elements. In some embodiments, the sidewalls of the cavity are in physical contact with the subset of the plurality of electrically conductive vias that circumscribe the respective one of the one or more antenna elements.

In some embodiments, the SIAA further comprises a dielectric on a surface of the one or more antenna elements opposite the substrate. In some embodiments, a thickness of the dielectric is less than $\lambda/4$, where $\lambda$ is a wavelength of a carrier frequency to be transmitted or received by the SIAA.

In some embodiments, the system further comprises a mechanical alignment mechanism that aligns the test fixture assembly with the SIAA such that the one or more cavities in the test fixture assembly are aligned with the one or more antenna elements, respectively. In some embodiments, the mechanical alignment mechanism comprises a groove around a periphery of one of the SIAA and the test fixture assembly and a ridge around a periphery of the other one of the SIAA and the test fixture assembly.

In some embodiments, the test fixture assembly further comprises one or more sensors in the one or more cavities, respectively. In some embodiments, the system further comprises a controller that processes signals output by the one or more sensors during transmission of signals from the one or more antenna elements to perform one or more measurements for each of the one or more antenna elements. In some embodiments, the one or more measurements comprise at least one of amplitude error, phase error, output power, error vector magnitude, and adjacent channel leakage ratio.

In some embodiments, the system further comprises a controller that generates signals that are injected into the one or more cavities by the one or more sensors and processes one or more received signals output by the one or more antenna elements during reception of the signals from the one or more sensors to perform one or more receive measurements for each of the one or more antenna elements. In some embodiments, the one or more receive measurements comprise at least one of a group consisting of: noise figure and receive sensitivity.

In some embodiments, a method comprises performing one or more measurements for each of one or more antenna elements on an SIAA using a test fixture assembly comprising one or more cavities formed by one or more materials providing isolation between the plurality of antenna elements. The one or more materials may include an electrically conductive material, a convective coated non-conductive material with a skin depth (i.e., thickness of the convective coating) that is sufficient to provide isolation between the plurality of antenna elements, one or more non-conductive materials that are doped to provide electrical conductivity, or the like. The test fixture assembly being positioned on a surface of the SIAA such that, for each cavity of the one or more cavities, sidewalls of the cavity circumscribe a respective one of the one or more antenna elements such that the one or more cavities electrically isolate the one or more antenna elements. The method further comprises utilizing the one or more measurements.

In some embodiments, utilizing the one or more measurements comprises utilizing the one or more measurements to calibrate the one or more antenna elements.

In some embodiments, utilizing the one or more measurements comprises providing information related to the one or more measurements along with the SIAA to another entity, wherein the information comprises at least one of a group consisting of: the one or more measurements and information derived from the one or more measurements.

In some embodiments, a method comprises obtaining an SIAA and information related to one or more measurements for each of one or more antenna elements on the SIAA, and utilizing the information.

In some embodiments, the one or more measurements for each of the one or more antenna elements on the SIAA were performed using a test fixture assembly comprising one or more cavities formed by one or more materials providing isolation between the plurality of antenna elements. The one or more materials may include an electrically conductive material, a convective coated non-conductive material with a skin depth (i.e., thickness of the convective coating) that is sufficient to provide isolation between the plurality of antenna elements, one or more non-conductive materials that are doped to provide electrical conductivity, or the like. While the one or more measurements for each of the one or more antenna elements were performed, the test fixture assembly was positioned on a surface of the SIAA such that, for each cavity of the one or more cavities, sidewalls of the cavity circumscribe a respective one of the one or more antenna elements such that the one or more cavities electrically isolate the one or more antenna elements.

In some embodiments, the SIAA comprises a substrate, one or more antenna elements at a surface of the substrate, and an electrically conductive via fence having a first side electrically coupled to ground within the substrate and a second side at the surface of the substrate. The electrically conductive via fence separately circumscribes each antenna element of the one or more antenna elements within the substrate.

In some embodiments, the substrate comprises a mechanical alignment feature.

In some embodiments, the SIAA further comprises a dielectric on a surface of the one or more antenna elements opposite the substrate. In some embodiments, a thickness of the dielectric is less than $\lambda/4$, where $\lambda$ is a wavelength of a carrier frequency to be transmitted or received by the SIAA.

Those skilled in the art will appreciate the scope of the present disclosure and realize additional aspects thereof after reading the following detailed description of the embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

For Substrate Integrated Antenna Array (SIAA) systems, the full radiation pattern may not currently be required to meet Third Generation Partnership Project (3GPP) conformance requirements. The test requirement for Equivalent Isotropically Radiated Power (EIRP)/Effective Isotropic Sensitivity (EIS) is for one point on the main beam at various steering angles and not a full 360 degree radiation pattern. This means that today's antenna testing ranges are not the only solution for testing SIAA base stations in order to meet the minimum requirement.

Systems and methods relating to performing individual transmit and/or receive measurements for each antenna element in an antenna array implemented on an AAS are disclosed. As used herein, an AASSIAA is a substrate (e.g., a Printed Circuit Board (PCB)) on which multiple antenna elements of an antenna array are implemented. In some embodiments, Radio Frequency (RF) components (e.g., components of a RF transmitter and/or a RF receiver) are also implemented on the SIAA.

Figure 1:
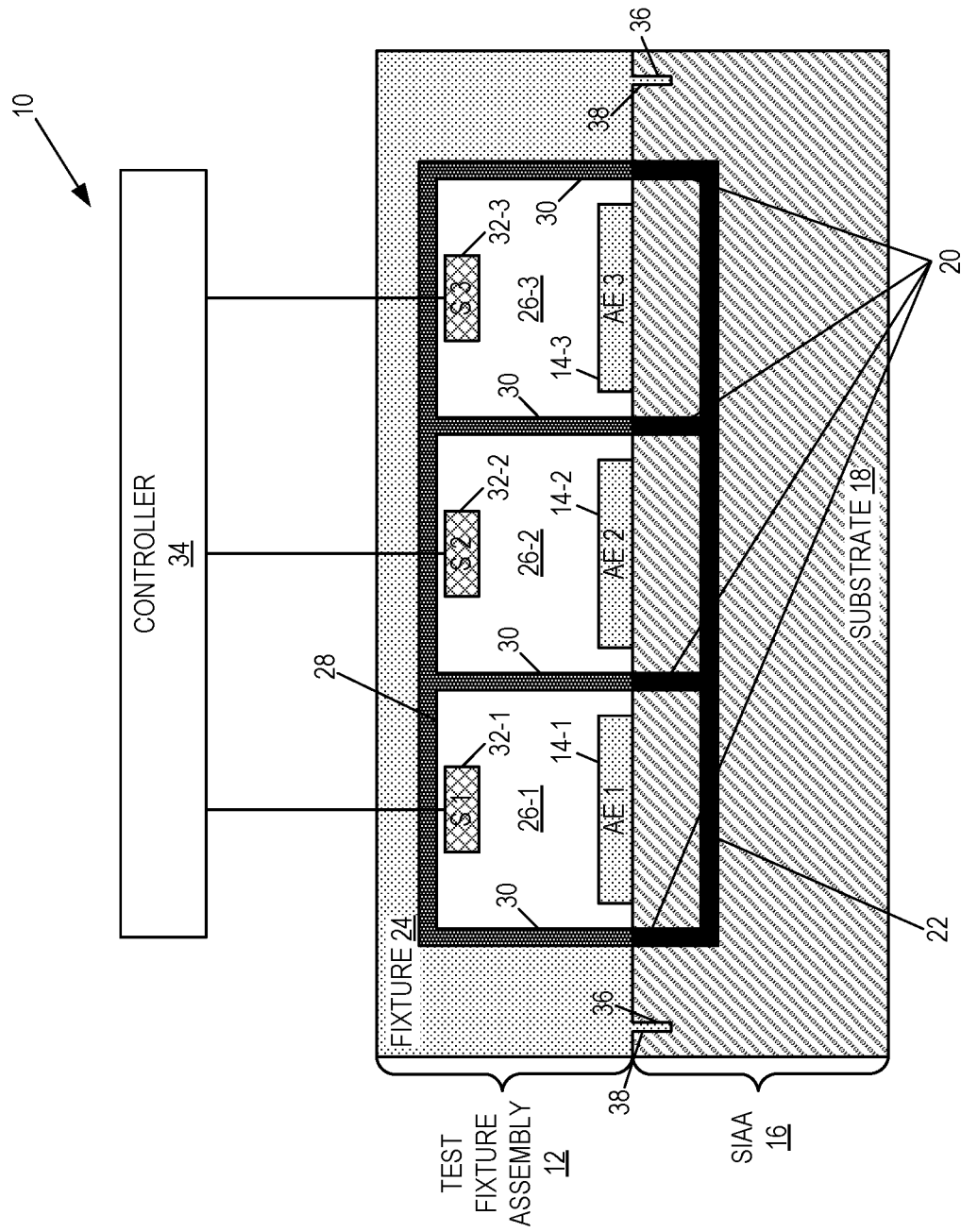
FIG. 1 illustrates a system including an Substrate Integrated Antenna Array (SIAA) and a test fixture assembly for obtaining per antenna element measurements according to some embodiments of the present disclosure.

In this regard, FIG. 1 illustrates a system 10 in which a test fixture assembly 12 is utilized to perform transmit and/or receive measurements for individual antenna elements 14 of an SIAA 16 according to some embodiments of the present disclosure. As illustrated, the SIAA 16 includes a substrate 18. The substrate 18 may be, for example, a PCB, but is not limited thereto. Other types of substrates 18 may be used. In this embodiment, the antenna elements 14 are structures on a surface of the SIAA 16. For simplicity and ease of discussion, in the illustrated example, there are three antenna elements 14, which are referenced as antenna elements 14-1, 14-2, and 14-3. However, it should be noted that the SIAA 16 may include many antenna elements 14 (e.g., 128 or more). The antenna elements 14 are formed of any suitable material such as, for example, an electrically conductive material, e.g., a metal. While metal is one example, other materials may be used. For example, a material that is suitable for a dielectric radiating antenna may be used. As discussed below with respect to FIGS. 5 and 6, in some other embodiments, the antenna elements 14 are slots forming respective slot antenna elements.

The SIAA 16 also includes an electrically conductive via fence 20. A first side of the electrically conductive via fence 20 is coupled to (e.g., physically connected to) ground within the substrate 18. In this particular example, the first side of the electrically conductive via fence 20 is coupled to a ground plate 22 within the substrate 18. A second side of the electrically conductive via fence 20 is at the surface of the substrate 18. In some embodiments, the second side of the electrically conductive via fence 20 is exposed at the surface of the substrate 18 or electrically and physically connected to a contact on the surface of the substrate 18.

However, in some embodiments, the second side of the electrically conductive via fence 20 is not exposed at the surface of the substrate 18 but is sufficiently near the surface of the substrate 18 to, together with the test fixture assembly 12, enable electrical isolation of the antenna elements 14.

In some embodiments, the electrically conductive via fence 20 is formed by many vias, or holes, in the substrate 18 that are filled with an electrically conductive material (e.g., a metal). In some other embodiments, the electrically conductive via fence 20 is formed by trenches formed into the surface of the substrate 18 that are filled with an electrically conductive material such that the electrically conductive via fence 20 is a continuous structure. Further, in some embodiments, the SIAA 16 includes a contact(s) on the surface of the substrate 18 over the electrically conductive via fence 20 to enable electrical and, in this example, physical contact between the electrically conductive via fence 20 and the test fixture assembly 12, as described below.

The electrically conductive via fence 20 separately circumscribes each of the antenna elements 14 within the substrate 18. In other words, the electrically conductive via fence 20 includes a first section that circumscribes the antenna element 14-1, a second section that circumscribes the antenna element 14-2, and a third section that circumscribes the antenna element 14-3. As discussed below in detail, together with the test fixture assembly 12, the electrically conductive via fence 20 forms a multi-cavity structure that electrically isolates each individual antenna element 14 such that measurements can be performed on the antenna elements 14 individually.

The test fixture assembly 12 includes a fixture 24, or support structure, and a number of cavities 26 formed by one or more materials 28 within the fixture 24 providing isolation between the plurality of antenna elements. The one or more materials 28 may include an electrically conductive material (e.g., a metal), a convective coated non-conductive material with a skin depth (i.e., thickness of the convective coating) that is sufficient to provide isolation between the plurality of antenna elements, one or more non-conductive materials that are doped to provide electrical conductivity, or similar material(s) having a low dielectric constant or suitable skin depth. In this example, there are three cavities 26, which are referenced as cavities 26-1, 26-2, and 26-3.

The test fixture assembly 12 is positioned on the SIAA 16 such that the cavities 26-1, 26-2, and 26-3 are aligned with the antenna elements 14-1, 14-2, and 14-3, respectively. More specifically, the test fixture assembly 12 is positioned on the SIAA 16 such that sidewalls 30 of the cavities 26-1, 26-2, and 26-3 are aligned with and electrically coupled to the sections of the electrically conductive via fence 20 that circumscribe the respective antenna elements 14-1, 14-2, and 14-3. As discussed above, one side (e.g., the top side in the illustrated example) of the electrically conductive via fence 20 is at the surface of the substrate 18 of the SIAA 16 to thereby enable electrical and, in this example, physical contact between the electrically conductive via fence 20 and the sidewalls 30 of the cavities 26. The cavities 26 have an appropriate geometry with respect to the electrically conductive via fence 20 that enables the cavities 26 together with the electrically conductive via fence 20 to electrically isolate the antenna elements 14. Specifically, the cavity 26-1 and the section of the electrically conductive via fence 20 that circumscribes the antenna element 14-1 electrically isolate the antenna element 14-1. In the same manner, the cavities 26-2 and 26-3 together with the respective sections of the electrically conductive via fence 20 that circumscribe the antenna elements 14-2 and 14-3 electrically isolate the antenna elements 14-2 and 14-3, respectively.

The test fixture assembly 12 also includes sensors 32 positioned within the cavities 26. Because they are within the cavities 26, the sensors 32, like the antenna elements 14, are electrically isolated from one another, thereby enabling per antenna element 14 or per transmit or receive chain measurements. In some embodiments, the sensors 32 detect signals transmitted from the respective antenna elements 14. Thus, the sensor 32-1 detects the signal transmitted from the antenna element 14-1, the sensor 32-2 detects the signal transmitted from the antenna element 14-2, and the sensor 32-3 detects the signal transmitted from the antenna element 14-3. The signals detected by the sensors 32 are output to a controller 34. Notably, the signals may be pre-processed (e.g., downconverted and Analog-to-Digital (A/D) converted) in the sensors or by circuitry connected between the sensors 32 and the controller 34 prior to processing by the controller 34. The controller 34 processes the signals to perform one or more measurements for each of the antenna elements 14 individually. The measurements may include, for example, one or more of: an amplitude error, a phase error, output power, Error Vector Magnitude (EVM), and Adjacent Channel Leakage Ratio (ACLR). However, these measurements are only examples. Additional or alternative measurements may be performed.

In addition or alternatively, in some embodiments, receive measurements (e.g., noise figure measurements) are performed. For example, in some embodiments, the sensors 32 transmit, or inject, signals generated by, e.g., the controller 34. The injected signals are received by the respective antenna elements 14 and processed by the respective receive chains included within the SIAA 16 or external to the SIAA. The processed signals are provided to the controller 34 and processed to perform one or more receive measurements for each of the antenna elements 14 individually. As another example, signals output by the antenna elements 14 may be processed to perform measurements when, e.g., no signals are being injected by the sensors 32 at the antenna elements 14.

The controller 34 may be implemented as hardware or a combination of hardware and software. For example, the controller 34 may be implemented as one or more processors (e.g., Application Specific Integrated Circuit(s) (ASIC(s)), Field Programmable Gate Array(s) (FPGA(s)), Digital Signal Processor(s) (DSP(s)), Central Processing Unit(s) (CPU (s)), and/or the like) and memory storing software instructions that when executed by the processor(s) cause the controller 34 to operate as described herein.

The test figure assembly 12 and the SIAA 16 also include mechanical alignment features to provide proper and precise alignment between the sidewalls 30 of the cavities 26 and the electrically conductive via fence 20. In this example, the mechanical features include a groove 36 in the surface of the substrate 18 around the periphery of the SIAA 16 and a respective ridge 38 around the periphery of the test fixture assembly 12. However, other mechanical alignment mechanisms (e.g., pins and holes) may be used.

Figure 2:
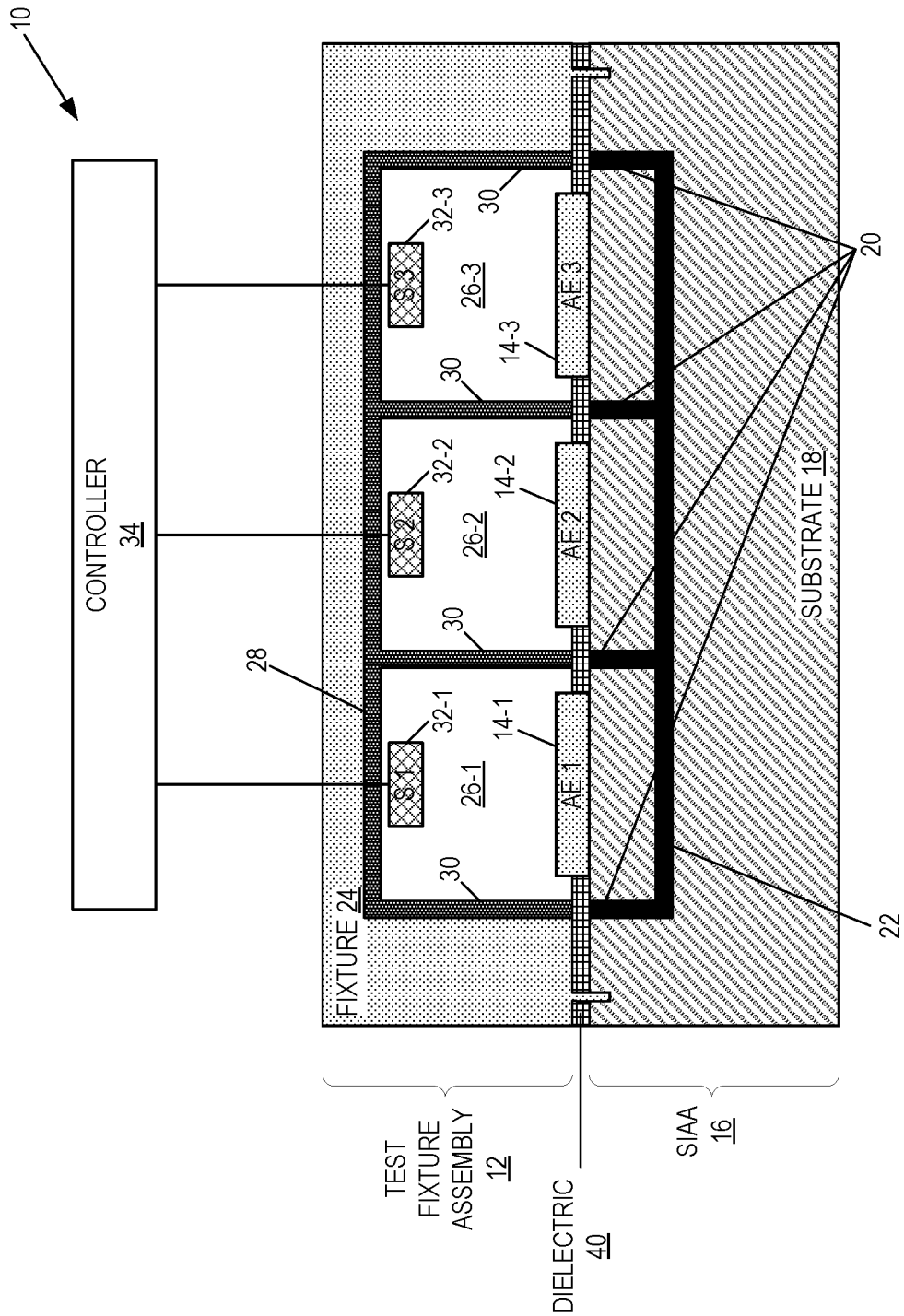
FIG. 2 illustrates one example variation of the system of FIG. 1 in which a dielectric structure is included on the SIAA over the antenna elements.

FIG. 2 illustrates a variation of the system 10 in which a dielectric 40, or dielectric structure, is included on the surface of the SIAA 16 and extends over the antenna elements 14 according to some embodiments of the present disclosure. In some embodiments, the dielectric 40 is a non-removable or removable dielectric raydome. If the dielectric 40 is non-removable, the dielectric 40 may, in some embodiments, cover the via fence 20, in which case the dielectric 40 may be doped in areas over the via fence 20 to become electrically conductive in those areas. The dielectric 40 includes one or more layers of a dielectric material. The dielectric 40 protects the SIAA 16 and, in particular, the antenna elements 14. Normally, a thickness of the dielectric 40 would be relatively large. Such a thick dielectric would prevent the test fixture assembly 12 from functioning as described herein. As such, in this embodiment, the dielectric 40 is sufficiently thin and/or doped to enable sufficiently good capacitive coupling between the sidewalls 30 of the cavities 26 and the electrically conductive via fence 20 at a desired frequency of operation. In other words, the dielectric 40 is sufficiently thin and/or doped, at least at the locations where the sidewalls 30 of the cavities 26 align with the electrically conductive via fence 20, to be electrically conductive. In some embodiments, the thickness of the dielectric 40 is less than $\lambda/4$, where $\lambda$ is a wavelength of a carrier frequency to be transmitted or received by the SIAA 16. In some alternative embodiments, the dielectric 40 is removable such that the dielectric 40 can be removed before attaching the test fixture assembly 12 to the surface of the SIAA 16 for testing of the antenna elements 14. Once testing is complete, the test fixture assembly 12 can be removed from the SIAA 16 and the dielectric 40 can be placed back onto the SIAA 16 for, e.g., normal operation. Alternatively, the dielectric 40 may or may not be removable and is not integrated onto the SIAA 16 until after testing using the test fixture assembly 12 is complete.

Figure 3A:
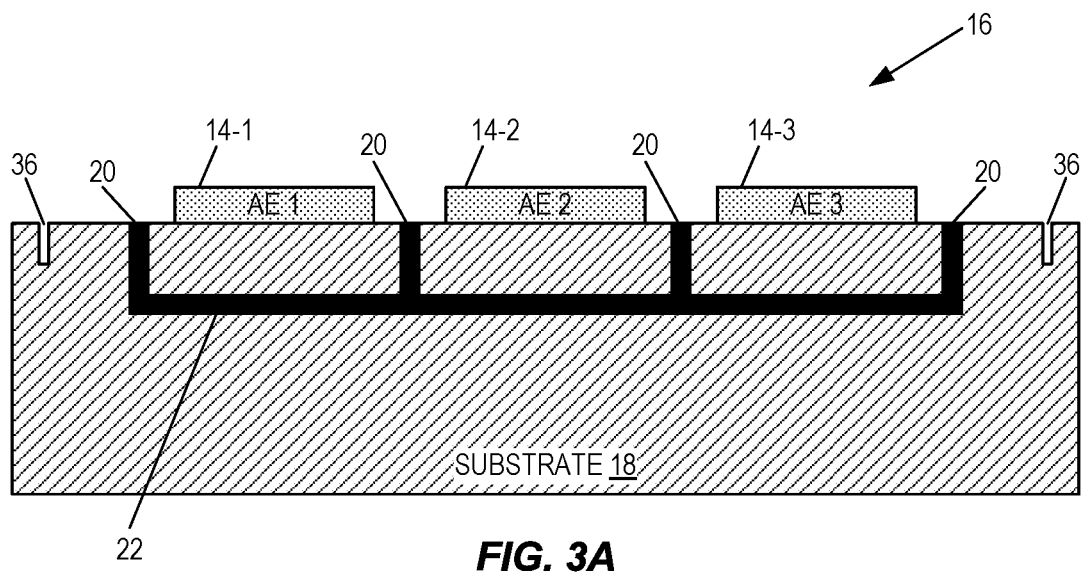
FIGS. 3A through 3C illustrate a cross-sectional view and two top-down views of two example embodiments of the SIAA of FIG. 1 according to some embodiments of the present disclosure.
Figure 3B:
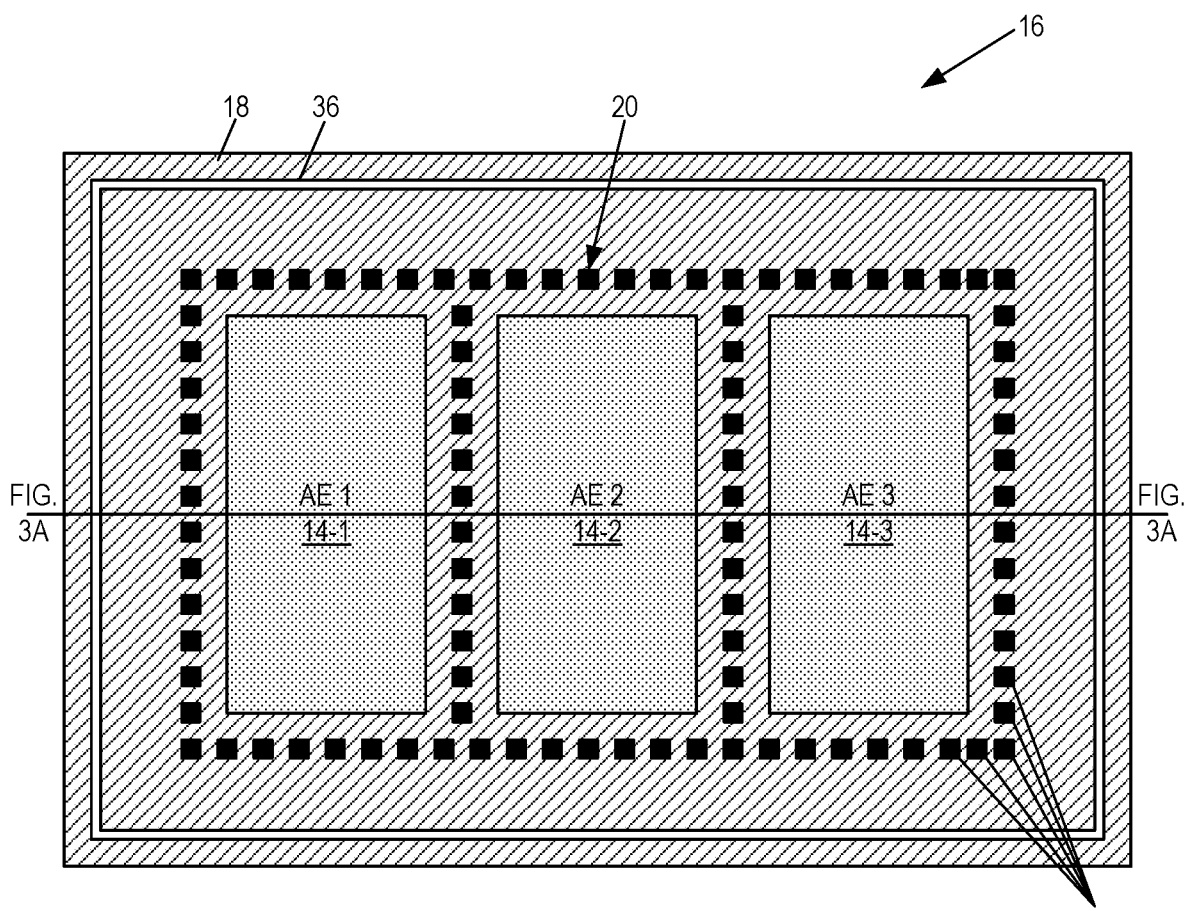
Figure 3C:
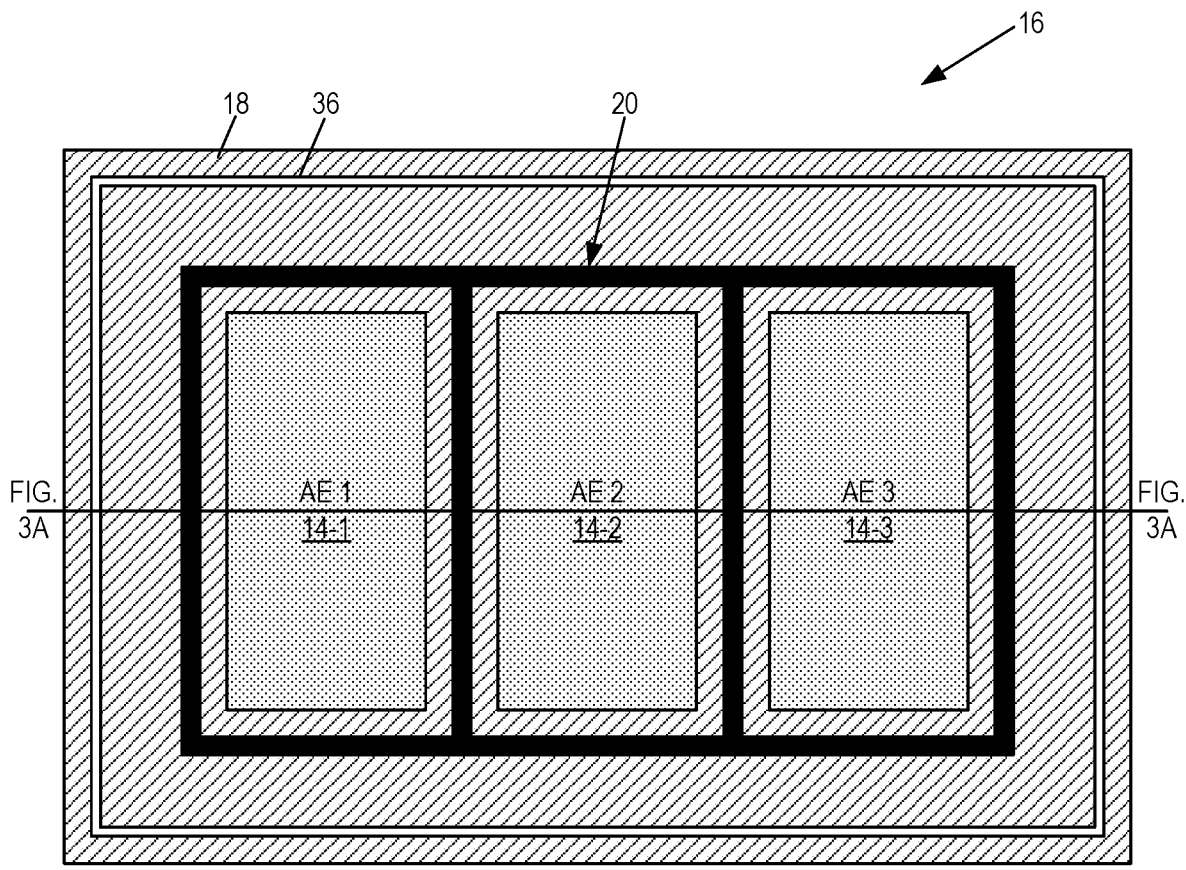

FIG. 3A and FIGS. 3B and 3C illustrate a cross-sectional view and top-down views of the SIAA 16 of FIG. 1, respectively, according to some example embodiments of the present disclosure. This discussion is equally applicable to the embodiment of FIG. 2 other than showing the dielectric 40. As illustrated in FIG. 3A and as described above, the SIAA 16 includes the substrate 18, the antenna elements 14 on the surface of the substrate 18, and the electrically conductive via fence 20. In this example, the SIAA 16 further includes the ground plate 22 within the substrate 18 to which the electrically conductive via fence 20 is coupled. In addition, in this example, the SIAA 16 includes the groove 36, which provides a mechanical alignment mechanism by which the sidewalls 30 of the cavities 26 of the test fixture assembly 12 (not shown) are properly aligned with the electrically conductive via fence 20.

As illustrated in FIG. 3B, in this example, the electrically conductive via fence 20 is formed by a number of vias 42 that extend from the surface of the substrate 18 to the ground plate 22. In other words, one end of each of the vias 42 is preferably exposed at the surface of the substrate 18 and the other end of each of the vias 42 is preferably coupled to (electrically and, potentially, physically) the ground plate 22. Each via 42 is a hole in the substrate 18 that is filled with a suitable material, which in this example is an electrically conductive material such as, e.g., metal. Note while the vias 42 have a square shaped cross-section in this example, the vias 42 may have a cross-section of any desired shape such as, e.g., square, rectangular, circular, or the like. Further, the size of the vias 42, the number of vias 42, and the spacing between the vias 42 may vary depending on the particular implementation. Still further, while not illustrated, a contact pad(s) may be provided on the surface of the substrate 18 over the vias 42 to enable or improve electrical and physical contact between the sidewalls 30 of the cavities 26 of the test fixture assembly 12 and the electrically conductive via fence 20. As can be seen in FIG. 3B, a first portion of the electrically conductive via fence 20 circumscribes the antenna element 14-1, a second portion circumscribes the antenna element 14-2, and a third portion circumscribes the antenna element 14-3.

It should be noted that the example of the electrically conductive via fence 20 illustrated in FIG. 3B is only an example. As another example, the electrically conductive via fence 20 may be formed by trenches into the surface of the substrate 18, where the trenches are filled within a suitable material such as, e.g., an electrically conductive material such as metal, as shown in FIG. 3C. Also, it should be noted that the shape of the antenna elements 14 shown in FIG. 3B is only an example. The shape of the antenna elements 14 may vary depending on the particular implementation.

As can be also seen in FIGS. 3B and 3C, in this example, the groove 36 extends around the periphery of the substrate 18. Again, the groove 36 is only one example of a mechanical alignment mechanism. Other mechanical alignment mechanisms may be used as will be appreciated by one of ordinary skill in the art upon reading this disclosure.

Figure 4A:
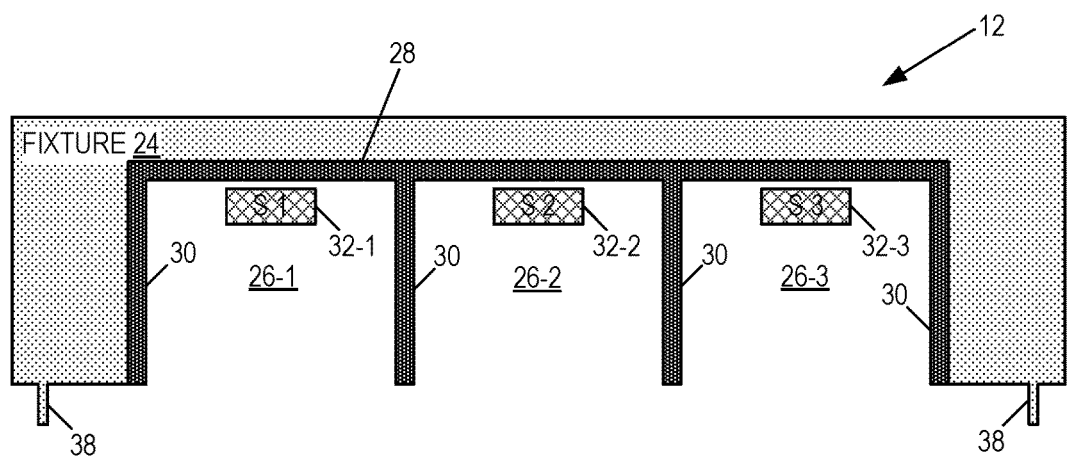
FIGS. 4A and 4B illustrate a cross-sectional view and a bottom-up view of the test fixture assembly of FIG. 1 according to some embodiments of the present disclosure.
Figure 4B:
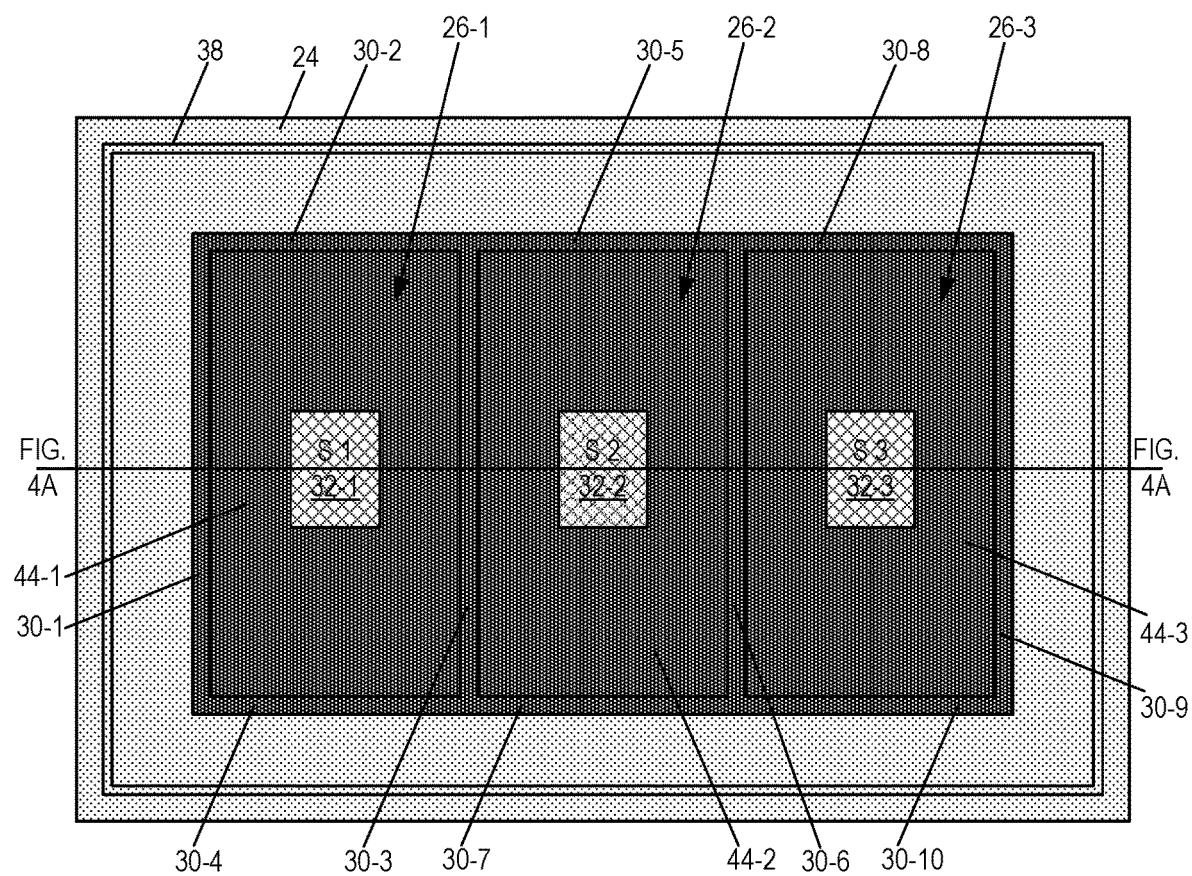

FIGS. 4A and 4B illustrate a cross-sectional view and a bottom-up view of the test fixture assembly 12 of FIG. 1, respectively, according to some embodiments of the present disclosure. As illustrated in FIG. 4A and as described above, the test fixture assembly 12 includes the fixture 24 and the one or more materials 28 within the fixture 24 that form the cavities 26. In addition, the test fixture assembly 12 includes the sensors 32 in the respective cavities 26. In this example, the test fixture assembly 12 also includes the ridge 38 that operates together with the groove 36 in the surface of the SIAA 16 to provide proper mechanical alignment between the sidewalls 30 of the cavities 26 and the electrically conductive via fence 20.

As illustrated in FIG. 4B, in this example, the material(s) 28 are utilized to form the cavities 26. In particular, the cavity 26-1 has sidewalls 30-1, 30-2, 30-3, and 30-4 as well as an upper surface 44-1 formed of the material(s) 28. The sensor 32-1 is, in this example, positioned on or near the upper surface 44-1 of the cavity 26-1. The cavity 26-2 has sidewalls 30-3, 30-5, 30-6, and 30-7 as well as an upper surface 44-2 formed of the material(s) 28. Note that, in this example, the cavities 26-1 and 26-2 share the common sidewall 30-3. The sensor 32-2 is, in this example, positioned on or near the upper surface 44-2 of the cavity 26-2. The cavity 26-3 has sidewalls 30-6, 30-8, 30-9, and 30-10 as well as an upper surface 44-3 formed of the material(s) 28. Note that, in this example, the cavities 26-2 and 26-3 share the common sidewall 30-6. The sensor 32-3 is, in this example, positioned on or near the upper surface 44-3 of the cavity 26-3.

Although the concepts disclosed herein are more suitable for designs for millimeter wave applications, the concepts disclosed herein are not frequency dependent upon millimeter wave. Any design which enables a connection of a test fixture assembly 12 such as one including an electrically conductive via fence 20 or wall between antenna elements 14 or sub-arrays on the antenna board may use the concepts disclosed herein.

Note that the coupling transfer function for each cavity 26 is derivable and can be characterized and, as such, can be removed from the respective measurement. Further, each sensor 32 provides an isolated measurement of conducted signals. This enables isolated transmit performance measurements for the active drive circuits of each antenna element 14 (e.g., linearity, etc.), enables isolated receive performance measurements for the noise figure, and enables time cost saving by enabling simultaneous measurements for all of the antenna elements 14. Still further, the test fixture assembly 12 enables the measurements without the need for connectors, which reduces cost and complexity. Further, the additional cost for manufacturing the SIAA 16 is minimal since only the addition of the electrically conductive via fence 20 and, optionally, the mechanical alignment mechanism is needed.

Figure 5:
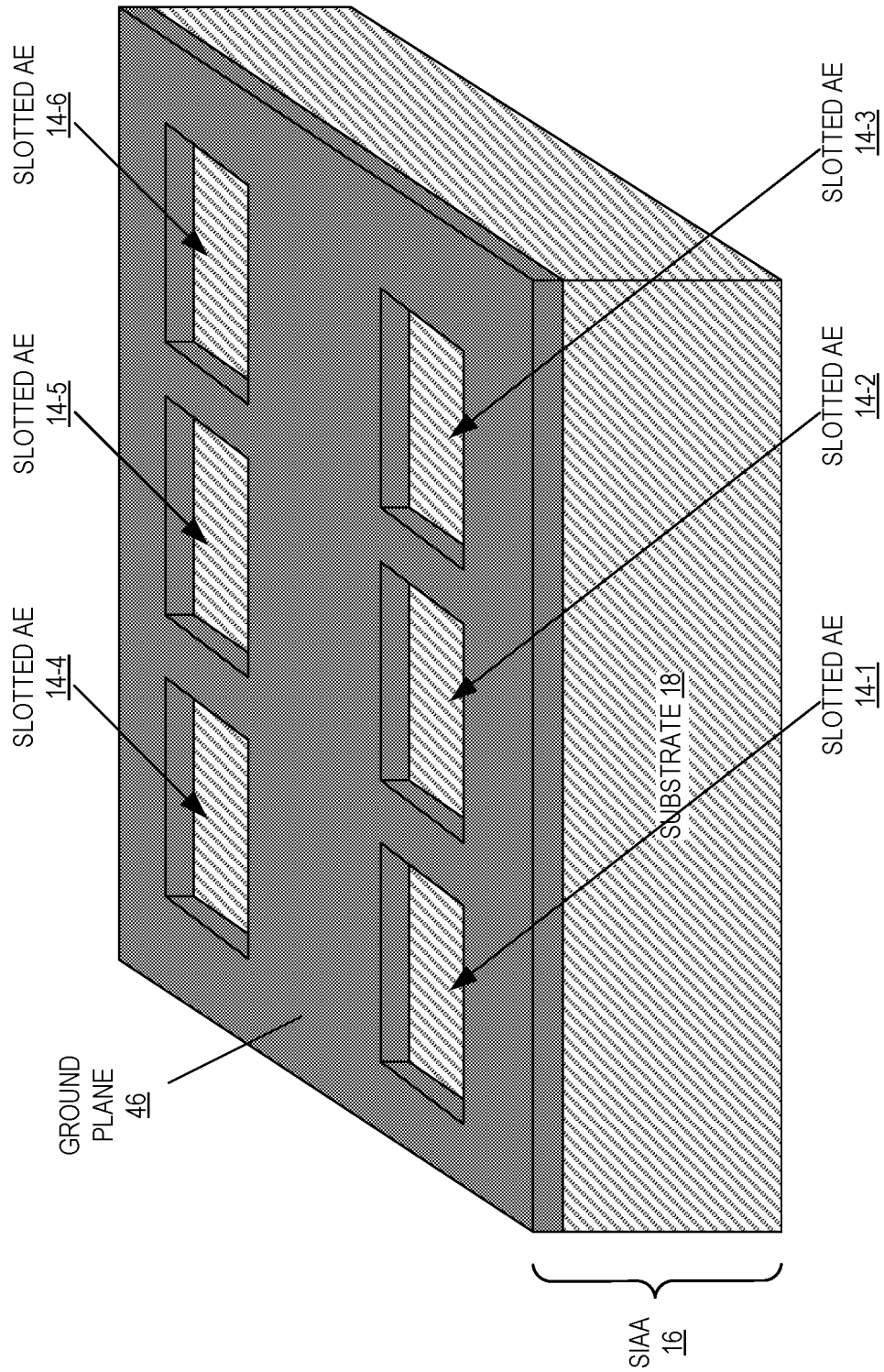
FIG. 5 illustrates the SIAA according to some other embodiments in which the antenna array is a slotted antenna array.

In the example embodiments above, the antenna elements 14 are illustrated as antenna elements 14 that are formed on the surface of the substrate 18. However, in some alternative embodiments, the antenna elements 14 are slots forming a slotted antenna. In this regard, FIG. 5 illustrates one example of the SIAA 16 in which the antenna array is a slotted antenna array in which the antenna elements 14 are slots formed in a ground plane 46 on the surface of the substrate 18. Note that while the slots are shown as having a rectangular shape in the example of FIG. 5, the shape of the slots will vary depending on the particular implementation (i.e., the slots can have any shape). The ground plane 46 is, at least in some embodiments, a metal layer that is connected to ground within the substrate 18. The slots are referred to as slotted antenna elements 14. As will be appreciated by one of skill in the art, a microstrip or similar structure within the substrate 18 operates to drive or excite the slotted antenna elements 14 and/or receive signals from the slotted antenna elements 14. While not illustrated in FIG. 5, the SIAA 16 also includes a mechanical alignment feature for aligning the test fixture assembly 12 with the SIAA 16, as described above. Also, in this embodiment, the electrically conductive via fence 20 is optional. As such, it is not shown. However, in some embodiments, the SIAA 16 using the slotted antenna array also includes the electrically conductive via fence 20, as described above.

Figure 6:
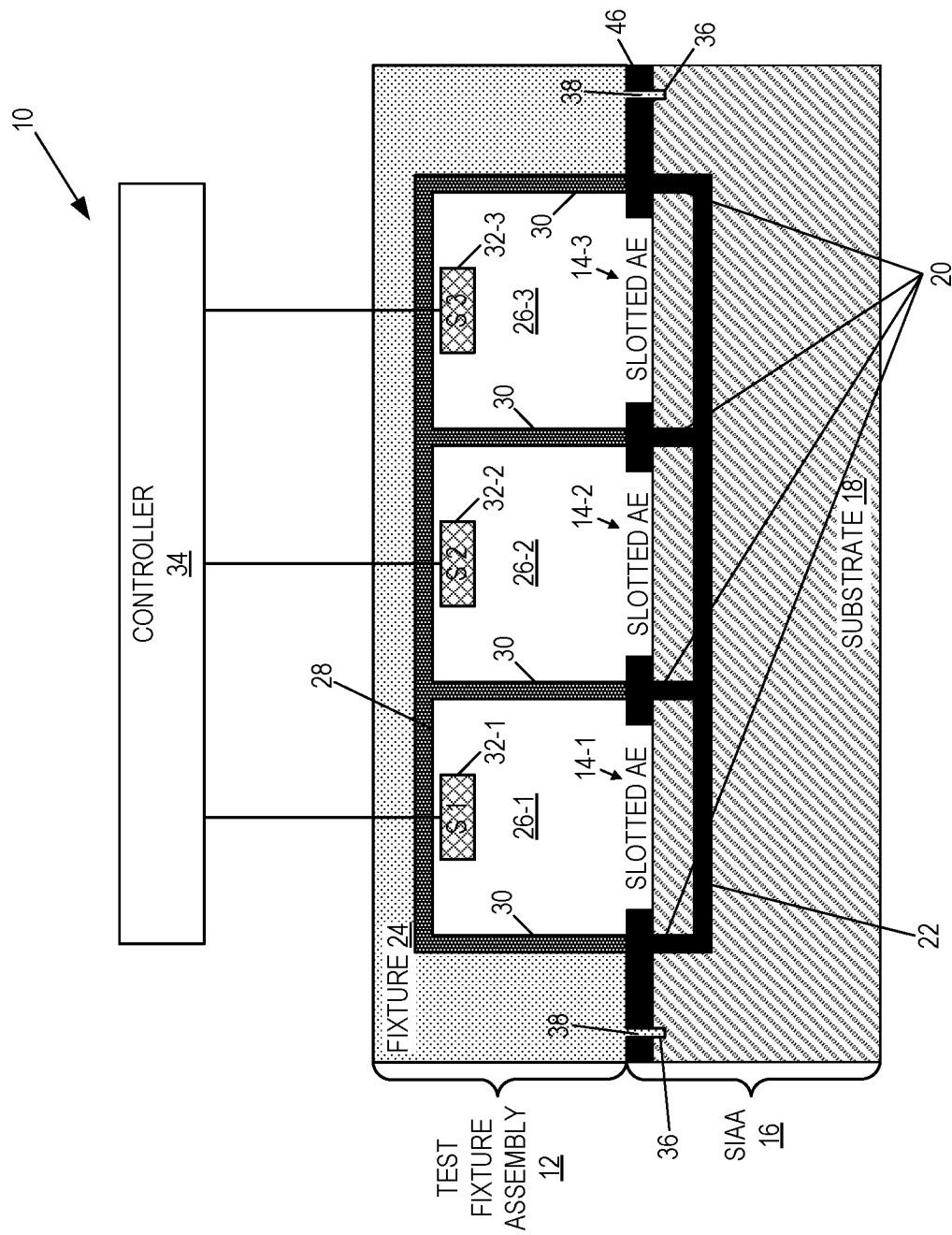
FIG. 6 illustrates a system including the SIAA of FIG. 5 and a test fixture assembly for obtaining per antenna element measurements according to some embodiments of the present disclosure.

FIG. 6 is a cross-sectional view of the SIAA 16 of FIG. 5 and the test fixture assembly 12 according to some embodiments of the present disclosure. In this example, the SIAA 16 includes the electrically conductive via fence 20 where the sidewalls 30 of the cavities 26 are aligned with the electrically conductive via fence 20, as described above. Again, note that the electrically conductive via fence 20 is optional in this embodiment. More specifically, since the ground plane 46 is already grounded, the test fixture 24 is grounded when the sidewalls 30 come into contact with the ground plane 46. As such, in some embodiments, the SIAA 16 does not include the via fence 20 since the sidewalls 30 of the test fixture 24 are already grounded.

As discussed above, the test fixture assembly 12 together with the electrically conductive via fence 20 of the SIAA 16 enable per antenna element measurements. With the knowledge of these per antenna element measurements, one of many corrective steps can be taken. For example, during manufacture, the SIAA 16 may be rejected if the per antenna element measurements indicate that any of the antenna elements 14 or any of the respective transmit or receive chains fail some predefined requirement at the cost of the SIAA 16 and the time spent. However, as another example, with the knowledge provided by the per antenna element measurements obtained using the test fixture assembly 12, the SIAA 16 could be shipped with information indicating the antenna element(s) 14 and related circuitry that should not be used when the SIAA 16 is deployed. This can be appropriate because, in antenna systems with a large number of antenna elements 14, each antenna element's contribution to the overall performance of the antenna array is diminished. Other examples of corrective actions could be to include a map of relative gains or phase errors. This error information can be used by a system to compensate for the manufactured quality of the SIAA 16.

Figure 7:
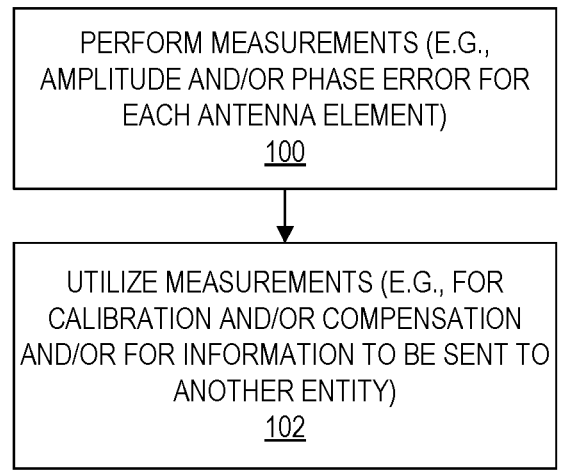
FIG. 7 illustrates a process relating to the use of the SIAA and test fixture assembly according to some embodiments of the present disclosure.
Figure 8:
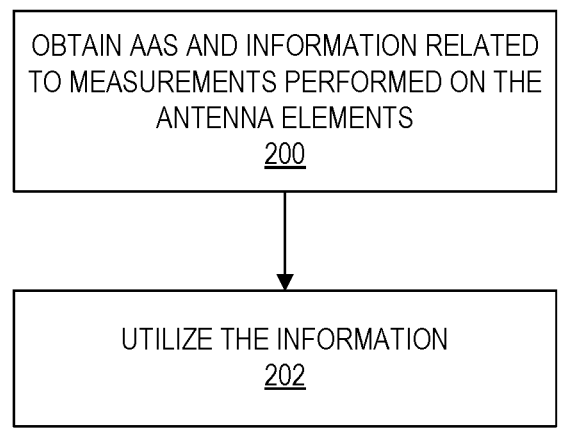
FIG. 8 illustrates a process relating to the use of the SIAA and test fixture assembly according to some other embodiments of the present disclosure.

In this regard, FIGS. 7 and 8 are flow charts that illustrate processes that utilize measurements obtained using the test fixture assembly 12 according to some embodiments of the present disclosure. In the process of FIG. 7, measurements are performed using the test fixture assembly 12 (step 100). The measurements are per antenna element measurements such as, for example, amplitude and/or phase error measurements for each antenna element 14. However, any desired type of per antenna element measurement may be performed. For example, for the transmit scenario, a signal(s) is(are) transmitted via the antenna elements 14. During transmission, the sensors 32 sense the respective signals output by the antenna elements 14 and provide respective signals to, e.g., the controller 34. The controller 34 then processes the sensed signals to provide the desired measurement(s). For example, amplitude and/or phase error measurements may be obtained by comparing (e.g., at baseband) the sensed signals to the respective signal(s) input to the transmit chains driving the antenna elements 14. As another example, for the receive scenario, the controller 34 may generate test signals and inject the text signals into the cavities 26 through the sensors 32 and obtain resulting output signals of the receive chains of the respective antenna elements 14. Based on the resulting output signals, the controller 34 may compute, e.g., noise figure measurements and/or receive sensitivity based on the output signals. Note that the examples above are non-limiting. Other types of measurements may be obtained in a similar manner, as will be appreciated by one of ordinary skill in the art upon reading this disclosure.

The measurements are then utilized (step 102). For example, a controller (e.g., the controller 34) may perform the measurements in step 100 or obtain the measurements from a measurement system that performed the measurements in step 100. The controller may then utilize the measurements for, e.g., compensation of the antenna array implemented on the SIAA 16 by, e.g., calibration of active components in the radio or transceiver chain. For example, the controller may calibrate an amplitude and/or phase error for each antenna element 14 or respective transmit or receive chain using respective measurements. As another example, the measurements may be utilized by providing the measurements or information derived from the measurements to another entity (e.g., a customer that will utilize the SIAA 16 in a system). This information may include, for example, the measurements or information that indicates which antenna elements 14 or which transmit or receive chain does not meet some predefined performance requirement. This information may be provided, e.g., by the manufacturer to, e.g., a customer or purchaser of the SIAA 16.

FIG. 8 is a flow chart that illustrates a process for obtaining and using information related to measurements performed on the antenna elements 14 of the SIAA 16 according to some embodiments of the present disclosure. This process may be performed by, e.g., a customer and/or a system implemented by a customer that purchases or otherwise acquires the SIAA 16 from the manufacturer. As illustrated, the SIAA 16 and information related to measurements performed on the antenna elements 14 are obtained (step 200). The measurements are per antenna element measurements performed using, e.g., the test fixture assembly 12, as described above. The information may be the measurements or information derived from the measurements, as described above. The information is then utilized (step 202). For example, the information may be utilized by, e.g., a controller in a system in which the SIAA 16 is integrated to, e.g., avoid the use of any antenna elements 14 that do not meet a predefined performance requirement and/or perform a compensation or calibration process by which non-ideal characteristics of the SIAA 16, as indicated by the information, are mitigated. For instance, the information may indicate an amplitude and/or phase error for each antenna element 14 and the system may operate to compensate for amplitude and/or phase error of at least some of the antenna elements 14.

The following acronyms are used throughout this disclosure.

3GPP Third Generation Partnership Project
5G Fifth Generation
SIAA Substrate Integrated Antenna Array
ACLR Adjacent Channel Leakage Ratio
A/D Analog-to-Digital
ASIC Application Specific Integrated Circuit
CPU Central Processing Unit
dB Decibel
DSP Digital Signal Processor
EIRP Equivalent Isotropically Radiated Power
EIS Effective Isotropic Sensitivity
EVM Error Vector Magnitude
FPGA Field Programmable Gate Array
GHz Gigahertz
PCB Printed Circuit Board
RF Radio Frequency Those skilled in the art will recognize improvements and modifications to the embodiments of the present disclosure. All such improvements and modifications are considered within the scope of the concepts disclosed herein.

What is claimed is:

1. A system comprising:
   a Substrate Integrated Antenna Array Substrate, SIAA, comprising:
      a substrate; and
      one or more antenna elements at a surface of the substrate; and
   a test fixture assembly comprising one or more cavities formed of one or more materials providing electrical isolation, wherein the test fixture assembly is positioned on the surface of the substrate of the SIAA such that, for each cavity of the one or more cavities, sidewalls of the cavity circumscribe a respective one of the one or more antenna elements such that the one or more cavities electrically isolate the one or more antenna elements.

2. The system of claim 1 wherein the one or more antenna elements comprise a plurality of antenna elements, and the one or more cavities comprise a plurality of cavities.

3. The system of claim 1 wherein the one or more antenna elements are antenna elements on the surface of the substrate.

4. The system of claim 1 wherein the one or more antenna elements are slotted antenna elements formed in a ground plane on the surface of the substrate.

5. The system of claim 1 wherein:
   the SIAA further comprises an electrically conductive via fence having a first side electrically coupled to ground within the substrate and a second side at the surface of the substrate, the electrically conductive via fence separately circumscribing each antenna element of the one or more antenna elements within the substrate; and
   the test fixture assembly is positioned on the surface of the substrate of the SIAA such that, for each cavity of the one or more cavities, the sidewalls of the cavity are aligned with and electrically coupled to sections of the electrically conductive via fence that circumscribe a respective one of the plurality of antenna elements such that the via fence and the one or more cavities electrically isolate the one or more antenna elements.

6. The system of claim 1 wherein the sidewalls of the cavity are in physical contact with the sections of the electrically conductive via fence that circumscribe the respective one of the one or more antenna elements.

7. The system of claim 5 wherein:
   the electrically conductive via fence comprises a plurality of electrically conductive vias each having a first end coupled to ground within the substrate and a second end at the surface of the substrate, the plurality of electrically conductive vias positioned in the substrate such that each antenna element of the one or more antenna elements is separately circumscribed by a respective subset of the plurality of electrically conductive vias; and
   the test fixture assembly is positioned on the surface of the substrate of the SIAA such that, for each cavity of the one or more cavities, the sidewalls of the cavity are aligned with and electrically coupled to the subset of the plurality of electrically conductive vias that circumscribe a respective one of the one or more antenna elements such that the electrically conductive via fence and the one or more cavities electrically isolate the one or more antenna elements.

8. The system of claim 7 wherein the sidewalls of the cavity are in physical contact with the subset of the plurality of electrically conductive vias that circumscribe the respective one of the one or more antenna elements.

9. The system of claim 1 wherein the SIAA further comprises a dielectric on a surface of the one or more antenna elements opposite the substrate.

10. The system of claim 9 wherein a thickness of the dielectric is less than $\lambda/4$, where $\lambda$ is a wavelength of a carrier frequency to be transmitted or received by the SIAA.

11. The system of claim 1 further comprising a mechanical alignment mechanism that aligns the test fixture assembly with the SIAA such that the one or more cavities in the test fixture assembly are aligned with the one or more antenna elements, respectively.

12. The system of claim 11 wherein the mechanical alignment mechanism comprises:
   a groove around a periphery of one of the SIAA and the test fixture assembly; and
   a ridge around a periphery of the other one of the SIAA and the test fixture assembly.

13. The system of claim 1 wherein the test fixture assembly further comprises one or more sensors in the one or more cavities, respectively.

14. The system of claim 13 further comprising a controller that processes signals output by the one or more sensors during transmission of signals from the one or more antenna elements to perform one or more measurements for each of the one or more antenna elements.

15. The system of claim 14 wherein the one or more measurements comprise at least one of a group consisting of: amplitude error, phase error, output power, error vector magnitude, and adjacent channel leakage ratio.

16. The system of claim 13 further comprising a controller that generates signals that are injected into the one or more cavities by the one or more sensors and processes one or more resulting signals output by the one or more antenna elements or one or more respective receive chains to perform one or more receive measurements for each of the one or more antenna elements.

17. The system of claim 16 wherein the one or more receive measurements comprise at least one of a group consisting of: noise figure and receive sensitivity.

* * * * *

UNITED STATES PATENT AND TRADEMARK OFFICE
CERTIFICATE OF CORRECTION

PATENT NO. : 10,910,729 B2
APPLICATION NO. : 16/774601
DATED : February 2, 2021
INVENTOR(S) : Sienkiewicz et al.

Page 1 of 1

It is certified that error appears in the above-identified patent and that said Letters Patent is hereby corrected as shown below:

In the Specification

In Column 1, Line 4, delete "2017," and insert -- 2017, now U.S. Pat. No. 10,622,724, --, therefor.

In Column 3, Line 7, delete "substrate The" and insert -- substrate. The --, therefor.

In Column 8, Line 64, delete "dielectric raydome." and insert -- dielectric radome. --, therefor.

In the Claims

In Column 13, Line 33, in Claim 1, delete "Array, Susbtrate," and insert -- Array, --, therefor.

Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*